(12) United States Patent
Kawagishi et al.

(10) Patent No.: US 9,816,161 B2
(45) Date of Patent: Nov. 14, 2017

(54) NI-BASED SINGLE CRYSTAL SUPERALLOY (71) Applicants: NATIONAL INSTITUTE FOR MATERIALS SCIENCE, Ibaraki (JP); MITSUBISHI HEAVY INDUSTRIES, LTD., Tokyo (JP)

(72) Inventors: Kyoko Kawagishi, Ibaraki (JP); Hiroshi Harada, Ibaraki (JP); Tadaharu Yokokawa, Ibaraki (JP); Yutaka Koizumi, Ibaraki (JP); Toshiharu Kobayashi, Ibaraki (JP); Masao Sakamoto, Ibaraki (JP); Michinari Yuyama, Ibaraki (JP); Masaki Taneike, Tokyo (JP); Ikuo Okada, Tokyo (JP); Sachio Shimohata, Tokyo (JP); Hidetaka Oguma, Tokyo (JP); Ryota Okimoto, Tokyo (JP); Keizo Tsukagoshi, Tokyo (JP); Yoshitaka Uemura, Tokyo (JP); Junichiro Masada, Tokyo (JP); Shunsuke Torii, Tokyo (JP)

(73) Assignees: MITSUBISHI HITACHI POWER SYSTEMS, LTD., Kanagawa (JP); NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 380 days.

(21) Appl. No.: 14/419,765

(22) PCT Filed: Jul. 30, 2013

(86) PCT No.: PCT/JP2013/070613
§ 371 (c)(1),
(2) Date: Feb. 5, 2015

(87) PCT Pub. No.: WO2014/024734
PCT Pub. Date: Feb. 13, 2014

(65) Prior Publication Data
US 2015/0197833 A1    Jul. 16, 2015

(30) Foreign Application Priority Data

Aug. 9, 2012  (JP) ................................ 2012-177573

(51) Int. Cl.
*C22F 1/10*        (2006.01)
*C22C 19/05*      (2006.01)
(Continued)

(52) U.S. Cl.
CPC .......... *C22C 19/057* (2013.01); *C22C 19/056* (2013.01); *C22F 1/10* (2013.01);
(Continued)

(58) Field of Classification Search
None
See application file for complete search history.

(56) References Cited

U.S. PATENT DOCUMENTS 3,887,363 A    6/1975  Smashey et al.
4,078,951 A *  3/1978  Denzine .................... C22F 1/10
                                                148/404
(Continued)

FOREIGN PATENT DOCUMENTS

EP    0 207 874    1/1987
EP    1 201 778    5/2002
(Continued)

OTHER PUBLICATIONS

International Search Report dated Sep. 3, 2013 in International (PCT) Application No. PCT/JP2013/070613.

*Primary Examiner* — Colleen Dunn
(74) *Attorney, Agent, or Firm* — Wenderoth, Lind & Ponack, L.L.P.

(57) ABSTRACT

Provided is a Ni-based single crystal superalloy containing 6% by mass or more and 12% by mass or less of Cr, 0.4% by mass or more and 3.0% by mass or less of Mo, (Continued)

6% by mass or more and 10% by mass or less of W,
4.0% by mass or more and 6.5% by mass or less of Al,
0% by mass or more and 1% by mass or less of Nb,
8% by mass or more and 12% by mass or less of Ta,
0% by mass or more and 0.15% by mass or less of Hf,
0.01% by mass or more and 0.2% by mass or less of Si, and
0% by mass or more and 0.04% by mass or less of Zr, and optionally containing at least one element selected from B, C, Y, La, Ce, and V,
with a balance being Ni and inevitable impurities.

18 Claims, 5 Drawing Sheets

(51) Int. Cl.
  F01D 5/28   (2006.01)
  C30B 29/52  (2006.01)
  C30B 11/00  (2006.01)
  C30B 33/02  (2006.01)

(52) U.S. Cl.
  CPC ........... C30B 29/52 (2013.01); F01D 5/28 (2013.01); *C30B 11/00* (2013.01); *C30B 33/02* (2013.01); *F05D 2300/132* (2013.01); *F05D 2300/175* (2013.01); *F05D 2300/607* (2013.01); *Y02T 50/671* (2013.01)

(56) References Cited

U.S. PATENT DOCUMENTS

| | | | |
|---|---|---|---|
| 4,643,782 A | 2/1987 | Harris et al. | |
| 4,677,035 A * | 6/1987 | Fiedler | C30B 11/00 148/404 |
| 4,719,080 A * | 1/1988 | Duhl | C30B 11/00 148/404 |
| 4,802,934 A | 2/1989 | Ohno et al. | |
| 5,043,138 A * | 8/1991 | Darolia | C22C 19/056 106/286.4 |
| 5,068,084 A * | 11/1991 | Cetel | C22C 19/057 420/443 |
| 5,077,004 A * | 12/1991 | Schweizer | C22C 19/056 148/404 |
| 5,077,141 A * | 12/1991 | Naik | C22C 19/056 148/404 |
| 5,395,584 A * | 3/1995 | Berger | B23K 35/304 228/119 |
| 5,399,313 A * | 3/1995 | Ross | C30B 11/00 148/404 |
| 5,489,346 A * | 2/1996 | Erickson | C22C 19/056 148/404 |
| 5,611,670 A | 3/1997 | Yoshinari et al. | |
| 5,740,668 A * | 4/1998 | Fujiwara | F01D 5/28 415/200 |
| 5,759,303 A * | 6/1998 | Mihalisin | C22C 19/057 148/428 |
| 5,916,382 A * | 6/1999 | Sato | C22C 19/056 148/404 |
| 6,051,083 A * | 4/2000 | Tamaki | B22D 27/045 148/404 |
| 6,641,929 B2 * | 11/2003 | Kelly | B32B 15/01 148/428 |
| 6,673,308 B2 * | 1/2004 | Hino | C22F 1/10 148/428 |
| 7,011,721 B2 * | 3/2006 | Harris | C22C 19/057 148/428 |
| 8,431,073 B2 * | 4/2013 | Hasselqvist | C22C 19/05 148/404 |
| 8,696,980 B2 * | 4/2014 | Nazmy | C22C 19/057 420/444 |
| 8,771,440 B2 * | 7/2014 | Sato | C22C 19/00 148/428 |
| 8,900,512 B2 * | 12/2014 | Harada | C22C 19/057 420/445 |
| 9,017,605 B2 * | 4/2015 | Nazmy | C22C 19/057 420/448 |
| 2006/0113009 A1 * | 6/2006 | Burgel | C22C 19/056 148/562 |
| 2008/0240926 A1 | 10/2008 | Kobayashi et al. | |
| 2009/0041615 A1 * | 2/2009 | James | C22C 19/056 420/443 |
| 2009/0214379 A1 * | 8/2009 | Yoshinari | C22C 19/057 420/448 |
| 2010/0143182 A1 * | 6/2010 | Sato | C22C 19/00 420/444 |
| 2010/0254822 A1 * | 10/2010 | Hazel | C22C 19/057 416/241 R |
| 2011/0076181 A1 * | 3/2011 | Suzuki | C22C 19/057 420/448 |
| 2011/0076182 A1 | 3/2011 | Suzuki | C22C 19/057 420/448 |
| 2011/0142714 A1 * | 6/2011 | Harada | C22C 19/057 420/445 |
| 2012/0128527 A1 * | 5/2012 | Nazmy | C22C 19/057 420/448 |
| 2015/0147226 A1 * | 5/2015 | Yoshinari | F01D 5/286 420/448 |

FOREIGN PATENT DOCUMENTS

| | | |
|---|---|---|
| JP | 62-116748 | 5/1987 |
| JP | 7-145703 | 6/1995 |
| JP | 2005-97650 | 4/2005 |
| JP | 2010-163659 | 7/2010 |
| WO | 2006/104059 | 10/2006 |

* cited by examiner

NI-BASED SINGLE CRYSTAL SUPERALLOY

TECHNICAL FIELD

The present invention relates to a Ni-based single crystal superalloy which is suitably used for members to be used under high temperatures and high stresses, such as turbine blades, turbine vanes, etc. in jet engines, gas turbines, and the like. In more detail, the present invention relates to a Ni-based single crystal superalloy which is enhanced in thermo-mechanical fatigue (TMF) characteristics at high temperatures, creep characteristics, and environment-resistant characteristics, is small in orientation dependence of creep characteristics, and is excellent in cost performance from the standpoint of practical use.

BACKGROUND ART

Ni-Based single crystal superalloys are used for members to be used under high temperatures and high stresses, such as turbine blades, turbine vanes, etc. in jet engines, gas turbines, and the like. In recent years, in gas turbine engines represented by jet engines and the like, in order to enhance output and efficiency, an inlet gas temperature of the turbine is made higher. Then, in order to keep high-temperature strength, turbine blades or turbine vanes of gas turbines have a hollow blade structure and prevent a temperature increase of a base material by forced cooling of the blade interior. However, a surface temperature of the blade of turbine blades or turbine vanes exceeds 900° C., whereas an internal temperature of the blade is about 600° C., so that a temperature difference between the surface and the interior of such a blade generates TMF.

In addition, the turbine blades are rotated at a high speed during being exposed to a high-temperature combustion gas and a centrifugal force is applied thereto, and therefore, they must endure a high-stress creep. Similar to TMF characteristics, creep characteristics are also important characteristics for the Ni-based single crystal superalloys. Examples of a cause of deteriorating the creep characteristics or TMF characteristics include precipitation of a TCP phase (topologically close packed phase), and in particular, a problem thereof is visualized in long-term use at high temperatures.

As for the Ni-based single crystal superalloys, PWA1480 (a trademark) or those described in PTLs 1, 2, 3, 4, and 5 as described below are known. However, these Ni-based single crystal superalloys are not sufficient in creep characteristics to contemplate increase of the efficiency by making a combustion gas temperature of the gas turbine higher. Then, Ni-based single crystal superalloys described in PTLs 6, 7, and 8 as described below, which contain expensive Re, appeared. However, as for the Re-containing Ni-based single crystal superalloys, when applied to large-sized members, a problem that the material costs are excessively expense is pointed out.

In addition, in the Ni-based single crystal superalloys, orientation dependence in which a deviation of angle in the <001> crystal orientation under high stresses largely influences the strength also becomes problematic. Small orientation dependence means that waste of manufacturing members becomes small. For this reason, the small orientation dependence is more advantageous as the size of the member is larger, and it may be considered that such is excellent in cost performance from the standpoint of practical use.

CITATION LIST

Patent Literature

PTL 1: U.S. Pat. No. 5,399,313
PTL 2: EP-1201778A2
PTL 3: EP-207874A2
PTL 4: U.S. Pat. No. 5,611,670
PTL 5: JP-A-7-145703
PTL 6: U.S. Pat. No. 4,643,782
PTL 7: U.S. Pat. No. 3,887,363
PTL 8: JP-A-2010-163659

SUMMARY OF INVENTION

Technical Problem

A problem of the present invention is to improve a Re-free first generation Ni-based single crystal superalloy and provide a Ni-based single crystal superalloy which is excellent in TMF characteristics, creep characteristics, and environment-resistant characteristics, small in orientation dependence of creep characteristics, and excellent in cost performance from the standpoint of practical use.

Solution to Problem

In order to solve the above-described problem, the present invention has the following characteristic features.

Specifically, the Ni-based single crystal superalloy of the present invention comprises 6% by mass or more and 12% by mass or less of Cr,
0.4% by mass or more and 3.0% by mass or less of Mo,
6% by mass or more and 10% by mass or less of W,
4.0% by mass or more and 6.5% by mass or less of Al,
0% by mass or more and 1% by mass or less of Nb,
8% by mass or more and 12% by mass or less of Ta,
0% by mass or more and 0.15% by mass or less of Hf,
0.01% by mass or more and 0.2% by mass or less of Si, and
0% by mass or more and 0.04% by mass or less of Zr, and
optionally containing at least one element selected from B, C, Y, La, Ce, and V,
with a balance being Ni and inevitable impurities.

In addition, the Ni-based single crystal superalloy of the present invention comprises 7% by mass or more and 12% by mass or less of Cr,
0.4% by mass or more and 2.5% by mass or less of Mo,
7% by mass or more and 10% by mass or less of W,
4.0% by mass or more and 6.5% by mass or less of Al,
0% by mass or more and 1% by mass or less of Nb,
9% by mass or more and 11% by mass or less of Ta,
0% by mass or more and 0.15% by mass or less of Hf,
0.01% by mass or more and 0.2% by mass or less of SI, and
0% by mass or more and 0.04% by mass or less of Zr, and
optionally containing at least one element selected from B, C, Y, La, Ce, and V,
with a balance being Ni and inevitable impurities.

In addition, the Ni-based single crystal superalloy of the present invention comprises 8% by mass or more and 10% by mass or less of Cr,
0.4% by mass or more and 2.0% by mass or less of Mo,
7% by mass or more and 9% by mass or less of W,
4.0% by mass or more and 6.5% by mass or less of Al,
0% by mass or more and 1% by mass or less of Nb,
10% by mass or more and 11% by mass or less of Ta, 0% by mass or more and 0.15% by mass or less of Hf,
0.01% by mass or more and 0.2% by mass or less of Si, and
0% by mass or more and 0.04% by mass or less of Zr, and
optionally containing at least one element selected from B, C, Y, La, Ce, and V,
with a balance being Ni and inevitable impurities.

In the Ni-based single crystal superalloy of the present invention, it is preferable that a composition ratio of the elements which are optionally contained is 0.05% by mass or less for B, 0.15% by mass or less for C, 0.1% by mass or less for Y, 0.1% by mass or less for La, 0.1% by mass or less for Ce, and 1% by mass or less for V.

In addition, in the Ni-based single crystal superalloy of the present invention, when a creep life τ(h) is represented by the following formula (1):

$$\tau(h) = -3208 + 11X_{Co} + 40X_{Cr} + 139X_{Mo} + 93X_W + 327X_{Al} + 146X_{Ti} + 45X_{Nb} + 53X_{Ta} \quad (1)$$

(wherein τ(h) represents a creep life (hour), and $X_{Co}$, $X_{Cr}$, $X_{Mo}$, $X_W$, $X_{Al}$, $X_{Ti}$, $X_{Nb}$, and $T_{Ta}$ represent composition ratios (% by mass) of cobalt, chromium, molybdenum, tungsten, aluminum, titanium, niobium, and tantalum, respectively),
τ(h) is preferably 120 or more.

In addition, in the Ni-based single crystal superalloy of the present invention, the creep life τ(h) is preferably 200 or more.

Advantageous Effects of Invention

The Ni-based single crystal superalloy of the present invention is excellent in TMF characteristics, creep characteristics, and environment-resistant characteristics such as high-temperature oxidation resistance, small in orientation dependence of creep characteristics, and excellent in cost performance from the standpoint of practical use.

DESCRIPTION OF EMBODIMENTS

The compositional components and composition ratios thereof in the Ni-based single crystal superalloy having the above-described characteristic features are based on the following viewpoints.

Cr (chromium) enhances high-temperature corrosion resistance and high-temperature oxidation resistance of the Ni-based single crystal superalloy. A composition ratio of Cr is 6% by mass or more and 12% by mass or less. When the composition ratio is less than 6% by mass, it is difficult to ensure the high-temperature corrosion resistance and high-temperature oxidation resistance, whereas when it is more than 12% by mass, a harmful phase such as a σ-phase, a μ-phase, etc. is formed, whereby the high-temperature strength is lowered. The composition ratio of Cr is preferably 7% by mass or more and 12% by mass or less, and more preferably 8% by mass or more and 10% by mass or less.

Mo (molybdenum) makes a value of gamma/gamma prime misfit negative, thereby promoting the raft effect that is one of reinforcement mechanisms at high temperatures. In addition, Mo dissolves in the matrix and contributes to an increase of the high-temperature strength by precipitation hardening. A composition ratio of Mo is 0.4% by mass or more and 3.0% by mass or less. When the composition ratio is less than 0.4% by mass, the high-temperature strength is lowered, whereas when it is more than 3.0% by mass, the harmful phase is formed, whereby the high-temperature strength is lowered. The composition ratio of Mo is preferably 0.4% by mass or more and 2.5% by mass or less, and more preferably 0.4% by mass or more and 2.0% by mass or less.

Similar to Mo, W (tungsten) has actions of solid solution reinforcement and precipitation hardening and enhances the high-temperature strength of the Ni-based single crystal superalloy. A composition ratio of W is 6% by mass or more and 10% by mass or less. When the composition ratio is less than 6%, the TMF characteristics and creep characteristics are lowered, whereas when it is more than 10% by mass, the harmful phase is formed, whereby the TMF characteristics and creep characteristics are lowered. The composition ratio of W is preferably 7% by mass or more and 10% by mass or less, and more preferably 7% by mass or more and 9% by mass or less.

Al (aluminum) compounds with Ni to form an intermetallic compound represented by Ni₃Al constituting a gamma prime phase that precipitates in a gamma matrix phase, thereby enhancing the TMF characteristics and creep characteristics especially on the low-temperature side of 1,000° C. or lower. A composition ratio of Al is 4.0% by mass or more and 6.5% by mass or less. When the composition ratio is less than 4% by mass, the amount of the gamma prime phase is small, so that the required TMF characteristics and creep characteristics are not obtained, whereas it is more than 6.5% by mass, the required TMF characteristics and creep characteristics are not obtained.

A composition ratio of Nb (niobium) is 0% by mass or more and 1% by mass or less. When the composition ratio is more than 1% by mass, the harmful phase is formed at high temperatures, whereby the TMF characteristics and creep characteristics are lowered.

Ta (tantalum) reinforces a gamma prime phase to enhance the creep characteristics. A composition ratio of Ta is 8% by mass or more and 12% by mass or less. When the composition ratio is less than 8% by mass, the required TMF characteristics and creep characteristics are not obtained, whereas when it is more than 12% by mass, the formation of a eutectic gamma prime phase is promoted, and it is difficult to perform a solution heat treatment. The composition ratio of Ta is preferably 9% by mass or more and 11% by mass or less, and more preferably 10% by mass or more and 11% by mass or less.

Hf (hafnium) has possibilities for enhancing the oxidation resistance and also improving the TMF characteristics. A composition ratio of Hf is 0% by mass or more and 0.15% by mass or less. When the composition ratio is more than 0.15% by mass, the formation of a harmful phase is promoted, whereby the TMF characteristics and creep characteristics are lowered.

Si (silicon) has possibilities for enhancing the oxidation resistance and also improving the TMF characteristics and further decreasing the orientation dependence of the single crystal, and so on. A composition ratio of Si is 0.01% by mass or more and 0.2% by mass or less. When the composition ratio is less than 0.01% by mass, the effects, such as an enhancement of the oxidation resistance, an improvement of the TMF characteristics, a decrease of the orientation dependence of the single crystal, etc., are not obtained. In addition, when the composition ratio is more than 0.2% by mass, a solid solution limit of other elements is lowered, so that the required TMF characteristics and creep characteristics are not obtained.

Although Zr (zirconium) is added for the purpose of reinforcing a grain boundary in a polycrystalline alloy, it has a possibility for improving especially the TMF characteristics in the Ni-based single crystal superalloy. A composition ratio of Zr is 0% by mass or more and less than 0.04% by mass.

The Ni-based single crystal superalloy having such a composition can further contain, for example, at least one element selected from B, C, Y, La, Ce, and V other than inevitable impurities. In this case, composition ratios of the respective components are preferably as follows.

B: 0.05% by mass or less
C: 0.15% by mass or less
Y: 0.1% by mass or less
La: 0.1% by mass or less
Ce: 0.1% by mass or less Incidentally, as described above, the Ni-based single crystal superalloy does not contain Co (cobalt). This is made for the purpose of increasing the TMF characteristics.

It may be considered that when Co is contained, a stacking fault is apt to be easily generated, thereby lowering the TMF characteristics. In addition, the Ni-based single crystal superalloy contains especially Hf, Si, and Zr (however, there may be the case where a composition ratio of each of Hf and Zr is 0% by mass) for the purpose of improving the TMF characteristics. It may be considered that even in a Co-free Ni-based superalloy, a twin crystal is formed on the 111 plane of a metal crystal, and dislocation develops to reach destruction. In the Ni-based single crystal superalloy containing Hf, Si, and Zr, since each of Hf, Si, and Zr is a component that segregates on an interface, there is a possibility that the development of dislocation is suppressed, whereby the TMF characteristics are improved.

In addition, in the Ni-based single crystal superalloy, from the viewpoint of creep characteristics, when a creep life $\tau(h)$ is represented by the following formula (1):

$$\tau(h) = -3208 + 11X_{Co} + 40X_{Cr} + 139X_{Mo} + 93X_W + 327X_{Al} + 146X_{Ti} + 45X_{Nb} + 53X_{Ta} \quad (1)$$

(wherein $\tau(h)$ represents a creep life (hour), and $X_{Co}$, $X_{Cr}$, $X_{Mo}$, $X_W$, $X_{Al}$, $X_{Ti}$, $X_{Nb}$, and $T_{Ta}$ represent composition ratios (% by mass) of cobalt, chromium, molybdenum, tungsten, aluminum, titanium, niobium, and tantalum, respectively), $\tau(h)$ is preferably 120 or more, and more preferably 200 or more. The foregoing formula (1) is a parameter prescribing the creep life of the Ni-based single crystal superalloy and is one newly derived with respect to a Re-free existing Ni-based superalloy by multiple regression analysis of a relation between its composition and a creep life under conditions at 900° C. and 392 MPa. An estimated value of the creep life which is estimated from the formula (1) is well coincident with an actual measurement of the creep life of the Re-free Ni-based superalloy at 900° C. and 392 MPa.

In addition, the Ni-based single crystal superalloy can be produced by subjecting a cast single crystal having a prescribed composition to the following heat treatment. That is, the heat treatment is a series of heat treatments as described below.

Solution treatment of keeping at 1,280° C. to 1,360° C. for 2 hours to 40 hours→cooling with air or cooling in an inert gas atmosphere at 200° C./min to 400° C./min→primary aging treatment of keeping at 1,000° C. to 1,200° C. for 2 hours to 5 hours, followed by cooling with air or cooling in an inert gas atmosphere→secondary aging treatment of keeping at 850° C. to 950° C. for 10 hours to 30 hours, followed by cooling with air or cooling in an inert gas atmosphere In such a series of heat treatments, from the viewpoint of being not influenced by high-temperature oxidation, it is preferable that in all of the treatments, keeping at a prescribed temperature for a prescribed time is performed in vacuo or in an inert gas atmosphere.

The Ni-based single crystal superalloy of the present invention is hereunder described in more detail by reference to the following Examples.

EXAMPLES

A Ni-based superalloy having a composition (% by mass) shown in Table 1 was melted using a vacuum melting furnace and cast with a lost wax casting mold as heated and kept, and the casting mold was drawn down at a solidification speed of 200 mm/h, thereby obtaining a cast single crystal. Subsequently, the obtained cast single crystal was preheated in vacuo at 1,300° C. for one hour and then subjected to a solution treatment of increasing the temperature and keeping at 1,330° C. for 10 hours, followed by cooling with air at about 300° C./min. Thereafter, the resultant was subjected to a primary aging treatment of keeping in vacuo at 1,100° C. for 4 hours, followed by cooling with air and a secondary aging treatment of keeping in vacuo at 870° C. for 20 hours, followed by cooling with air. In the Ni-based single crystal superalloys of Examples 1 to 7, a temperature range of the solution treatment is 1,310° C. to 1,360° C., and a temperature range of the primary aging treatment is 1,000° C. to 1,150° C. Known PWA1480 which was used in Reference Example 1 was subjected to heat treatments of keeping at 1,288° C. for 4 hours, followed by cooling with air, subsequently keeping at 1,080° C. for 4 hours, followed by cooling with air, and thereafter keeping at 871° C. for 32 hours, followed by cooling with air.

TABLE 1

| | Constitutional elements (% by mass) | | | | | | | | | | | | |
|---|---|---|---|---|---|---|---|---|---|---|---|---|---|
| Sample | Co | Cr | Mo | W | Al | Ti | Nb | Ta | Hf | Si | Zr | C | B | Ni |
| Example 1 | — | 8.7 | 1.2 | 8.1 | 5.3 | — | 0.05 | 10.2 | 0.08 | 0.04 | 0.01 | — | — | Balance |
| Example 2 | — | 9.0 | 0.6 | 7.6 | 5.4 | — | — | 10.0 | — | 0.08 | 0.01 | — | — | Balance |
| Example 3 | — | 9.3 | 0.8 | 7.8 | 5.25 | — | — | 9.75 | 0.1 | 0.06 | 0.01 | — | — | Balance |
| Example 4 | — | 9.3 | 0.8 | 7.8 | 5.4 | — | — | 10.0 | 0.1 | 0.04 | 0.01 | — | — | Balance |
| Example 5 | — | 8.7 | 0.4 | 7.4 | 5.55 | — | — | 10.25 | — | 0.06 | 0.01 | — | — | Balance |
| Example 6 | — | 8.7 | 0.4 | 7.4 | 5.25 | — | — | 9.75 | 0.05 | 0.01 | — | — | — | Balance |
| Example 7 | — | 9.0 | 0.8 | 7.8 | 5.4 | — | — | 10.0 | — | 0.05 | — | 0.08 | 0.01 | Balance |
| Reference Example 1 | 5.0 | 10.0 | — | 4.0 | 5.0 | 1.5 | — | 12.0 | — | — | — | — | — | Balance |

The cast single crystal superalloy after the heat treatments was worked into a creep test piece having a diameter of 4 mm and a length of 20 mm in a parallel part thereof, which was then tested for a creep test under conditions at 900° C. and 392 MPa or at 1,100° C. and 245 MPa. In addition, a test piece having a diameter of 5 mm and a length of 15 mm in a parallel part thereof was tested for a TMF test by heating with high-frequency waves. In the TMF test, the temperature range was varied from 400° C. as a lower limit to 900° C. as an upper limit, and a strain of ±0.64% was imparted in cooperation with this temperature change. The frequency was 66 minutes in one cycle, a waveform thereof was made a triangular wave, and the sample was kept compressed for 60 minutes. These test conditions are those imitated for driving conditions of a gas turbine, and a surface temperature of a turbine blade was assumed to be 900° C. during constant driving and 400° C. during shutdown, respectively. In addition, a temperature increase/decrease rate was set up at 166.7° C./min. The TMF characteristics are evaluated in terms of a repetition number until the test piece ruptures.

Table 2 shows a calculated value of the creep life τ(h) and an actual measurement in a creep test under conditions at 900° C. and 392 MPa or at 1.100° C. and 245 MPa. As is clear from Table 2, it is confirmed that all of the Ni-based single crystal superalloys of Examples 1 to 6 have more excellent creep characteristics than those of PWA1480 as Reference Example 1.

TABLE 2

| | | Actual measurement in creep test (h) | |
|---|---|---|---|
| Sample | Calculated value of τ(h) | 900° C., 392 MPa | 1100° C., 245 MPa |
| Example 1 | 358 | 304 | 164 |
| Example 2 | 238 | 266 | 237 |
| Example 3 | 234 | 245 | 74 |
| Example 4 | 296 | 275 | 32 |
| Example 5 | 242 | 230 | 33 |
| Example 6 | 147 | 161 | 56 |
| Reference Example 1 | 110 | 83 | 18 |

Figure 1:
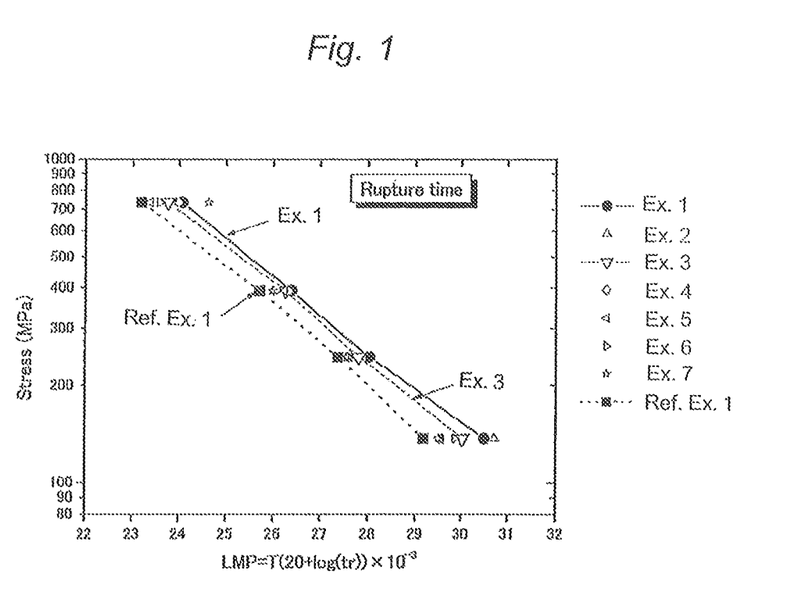
FIG. 1 is a graph showing results obtained by performing a creep test while varying a condition in terms of a relation between a Larson-Miller parameter and a strain.
Figure 2:
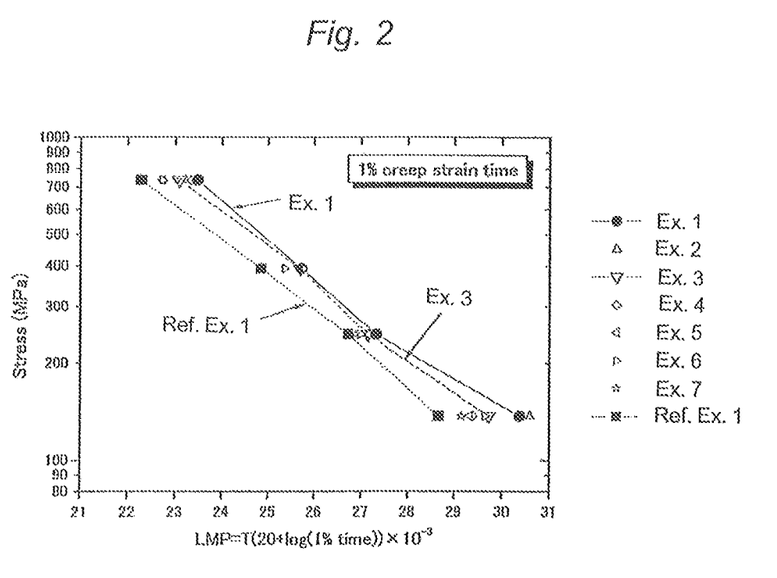
FIG. 2 is a graph showing results obtained by performing a creep test while varying a condition in terms of a relation between a Larson-Miller parameter and a strain.

In addition, with respect to the Ni-based single crystal superalloys of Examples 1 to 7 and PWA1480 of the Reference Example 1, the creep test was performed while varying the conditions. The results are shown in FIGS. 1 and 2. LMP taken on the abscissa of FIG. 1 is a Larson-Miller parameter and is known as a parameter for rearranging a rupture time under a different temperature condition. In FIG. 1, in the formula that defines LMP, T represents a temperature (K), and $t_r$ represents a rupture time (h). In addition, in FIG. 2, the 1% creep strain time that defines LMP represents a 1% creep strain arrival time (h). It is meant that when LMP is larger, the sample endures the creep at a higher temperature or for a longer time.

It is also confirmed from FIGS. 1 and 2 that the Ni-based single crystal superalloys of Examples 1 to 7 are excellent in creep characteristics as compared with PWA1480 of Reference Example 1.

The results of the TMF test are shown in Table 3. While PWA1480 (Reference Example 1) is known to be excellent especially in TMF characteristics, the Ni-based single crystal superalloys of Examples 1 to 6 have a TMF number of times of 130 to 288 times and are confirmed to have excellent TMF characteristics.

TABLE 3

| Sample | TMF number of times |
|---|---|
| Example 1 | 259 |
| Example 2 | 277 |
| Example 3 | 274 |
| Example 4 | 260 |
| Example 5 | 288 |
| Example 6 | 130 |
| Reference Example 1 | 368 |

In addition, in order to examine the environment-resistant characteristics, an oxidation test by repeated exposure was performed. The oxidation test was carried out by two conditions of electric furnace heating and kerosene burnering. In the electric furnace heating, an operation of heating the sample at 1,100° C. in an air atmosphere furnace and keeping at this time for one hour was taken as one cycle, and this operation was performed by 50 cycles, followed by measuring a mass change of the sample. In the burnering, the sample was heated at 1,100° C. and kept at this temperature for one hour, followed by measuring a mass change of the sample. The results of the oxidation test are shown in Table 4.

TABLE 4

| Sample | Mass change by electric furnace heating 1100° C., 1 h/cycle 50 cycles (mg/cm$^2$) | Mass change by kerosene burnering 1100° C., 1 h/cycle 1 cycle (mg/cm$^2$) |
|---|---|---|
| Example 1 | 0.1 to 0.3 | Not carried out |
| Example 2 | −0.5 | 0.1 |
| Example 3 | 0.1 to 0.3 | 0.1 |
| Example 4 | 0.1 to 0.3 | Not carried out |
| Example 5 | 0.1 to 0.3 | Not carried out |
| Example 6 | 0.1 to 0.3 | Not carried out |

TABLE 4-continued

| Sample | Mass change by electric furnace heating 1100° C., 1 h/cycle 50 cycles (mg/cm²) | Mass change by kerosene burnering 1100° C., 1 h/cycle 1 cycle (mg/cm²) |
|---|---|---|
| Example 7 | 0.1 to 0.3 | Not carried out |
| Reference Example 1 | −1.84 | 0.8 |

In the oxidation test by electric furnace heating, though a slight reduction in weight is confirmed in the Ni-based single crystal superalloy of Example 2, the Ni-based single crystal superalloys of the other Examples are free from a reduction in weight and are confirmed to be excellent in antioxidation characteristics. In PWA1480 (Reference Example 1), separation of the oxide film was observed. On the basis of the results of the oxidation test by electric furnace heating, the oxidation test by kerosene burnering was performed for the Ni-based single crystal superalloys of Examples 2 and 3 and PWA1480 of Reference Example 1. In the oxidation test by kerosene burnering, a significant difference was observed at one cycle. In the Ni-based single crystal superalloys of Examples 2 and 3, the metal glossy surface was kept as it was, whereas PWA1480 (Reference Example 1) was covered by an oxide film assuming a gray color. From these results, the Ni-based single crystal superalloys of Examples 1 to 7 are evaluated to be excellent in antioxidation characteristics.

It is known that when a slant angle of a single crystal from the growth direction becomes large, the creep strength is lowered. When cast into a turbine blade, from the viewpoint that the yield is enhanced, even if a slant angle of a crystal in the longitudinal direction becomes large, it is required that the creep strength is not greatly deteriorated within 15° from the <001> crystal orientation. Then, the orientation dependence of creep characteristics regarding the Ni-based single crystal superalloy of Example 1 was examined in detail. The creep conditions were set up at 900° C. and 392 MPa or at 1,000° C. and 245 MPa. The creep life in a range where an orientation difference from the <001> crystal orientation that is the growth direction of a single crystal was from 1.5° to 12.5° at maximum was 230 hours to 330 hours under the creep conditions at 900° C. and 392 MPa. A tendency in which the creep life becomes short with an increase of the orientation difference was not perceived. In addition, the creep life was 80 hours to 100 hours under the creep conditions at 1,000° C. and 245 MPa, and the dependence of the creep life upon the orientation difference was not perceived similarly. Accordingly, it is confirmed that the Ni-based single crystal superalloy of Example 1 is small in the orientation dependence of creep characteristics.

Figure 3:
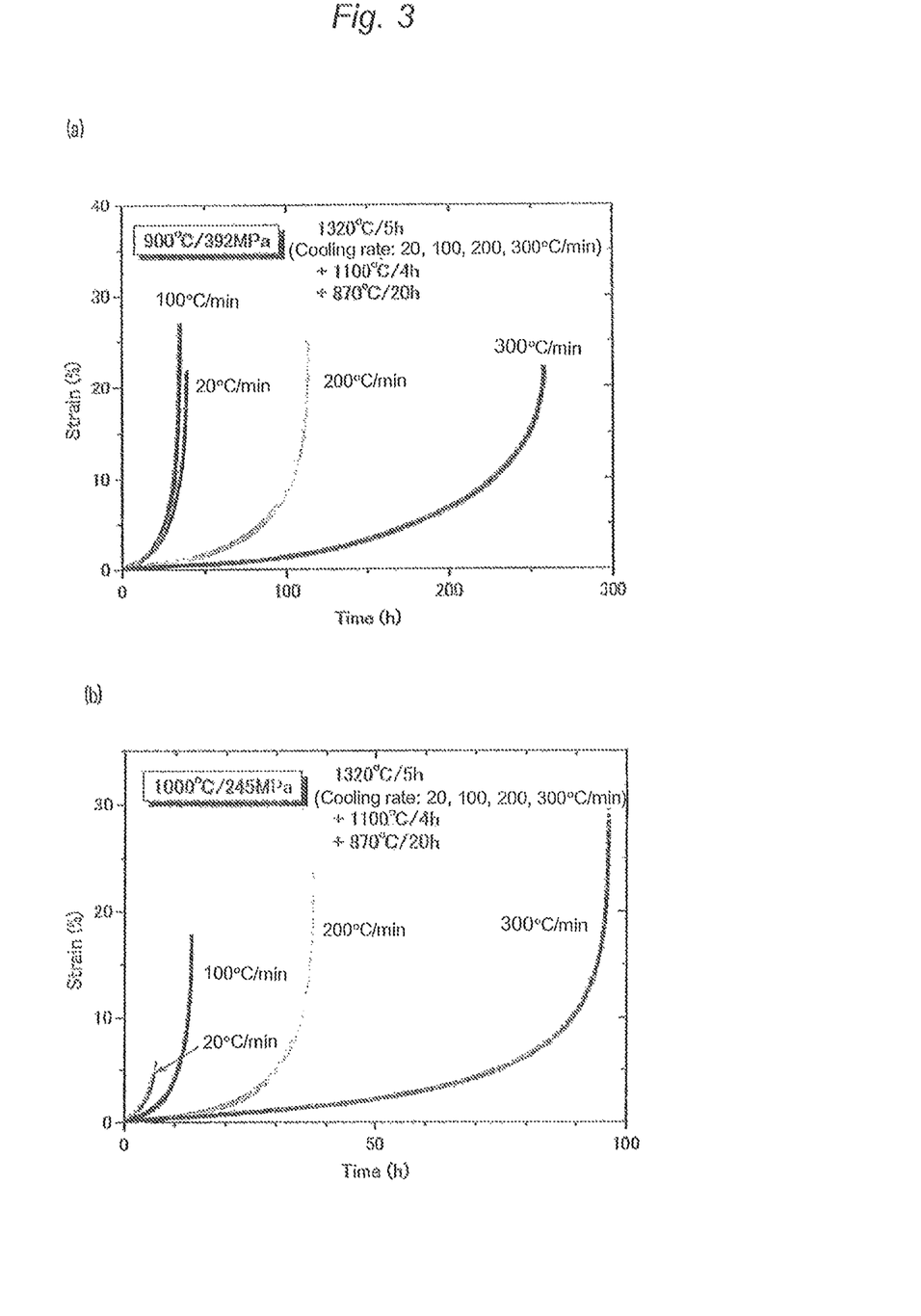
FIGS. 3(a) and 3(b) are each a graph showing any influence of a cooling rate after solution treatment against creep characteristics.

In addition, with respect to the Ni-based single crystal superalloy of Example 3, by varying a cooling rate in cooling with air after the solution treatment to 20° C./min, 100° C./min, 200° C./min, and 300° C./min, respectively, any influence of the cooling rate against the creep characteristics was examined. The results are shown in FIGS. 3(a) and 3(b). Incidentally, a production process of the Ni-based single crystal superalloy was made a series of heat treatments of solution treatment of keeping the cast single crystal at 1,320° C. for 5 hours→primary aging treatment of keeping at 1,100° C. for 4 hours→secondary aging treatment of keeping at 870° C. for 20 hours.

As is confirmed from FIGS. 3(a) and 3(b), even in the case of any of creep conditions at 900° C. and 392 MPa and at 1,000° C. and 245 MPa, when the cooling rate is 300° C./min, the most excellent creep characteristics are obtained. Since the Ni-based single crystal superalloy of the present invention does not contain Re in the composition, it is confirmed that it is apt to be influenced by the cooling rate. Incidentally, it may be considered that so long as the cooling rate at the time of cooling with air after the solution treatment is 200° C./min, the required creep characteristics are realized.

Figure 4:
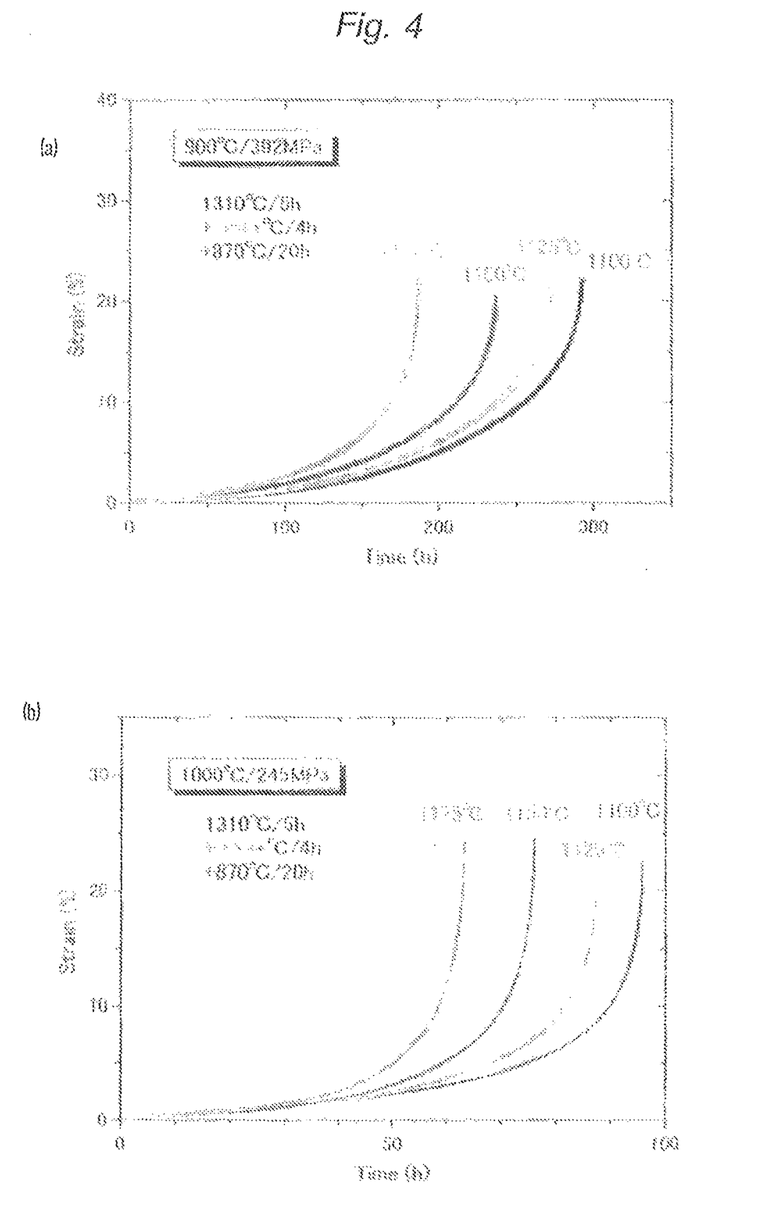
FIGS. 4(a) and 4(b) are each a graph showing any influence of a temperature of primary aging treatment against creep characteristics.

In addition, with respect to the Ni-based single crystal superalloy of Example 3, by varying the temperature of the primary aging treatment to 1,100° C., 1,125° C., 1,150° C., and 1,175° C., respectively, any influence of the temperature of the primary aging treatment against the creep characteristics was examined. The results are shown in FIGS. 4(a) and 4(b). Incidentally, a production process of the Ni-based single crystal superalloy was made a series of heat treatments of solution treatment of keeping the cast single crystal at 1,310° C. for 5 hours→primary aging treatment of keeping at each of the temperatures for 4 hours→secondary aging treatment of keeping at 870° C. for 20 hours.

Figure 5:
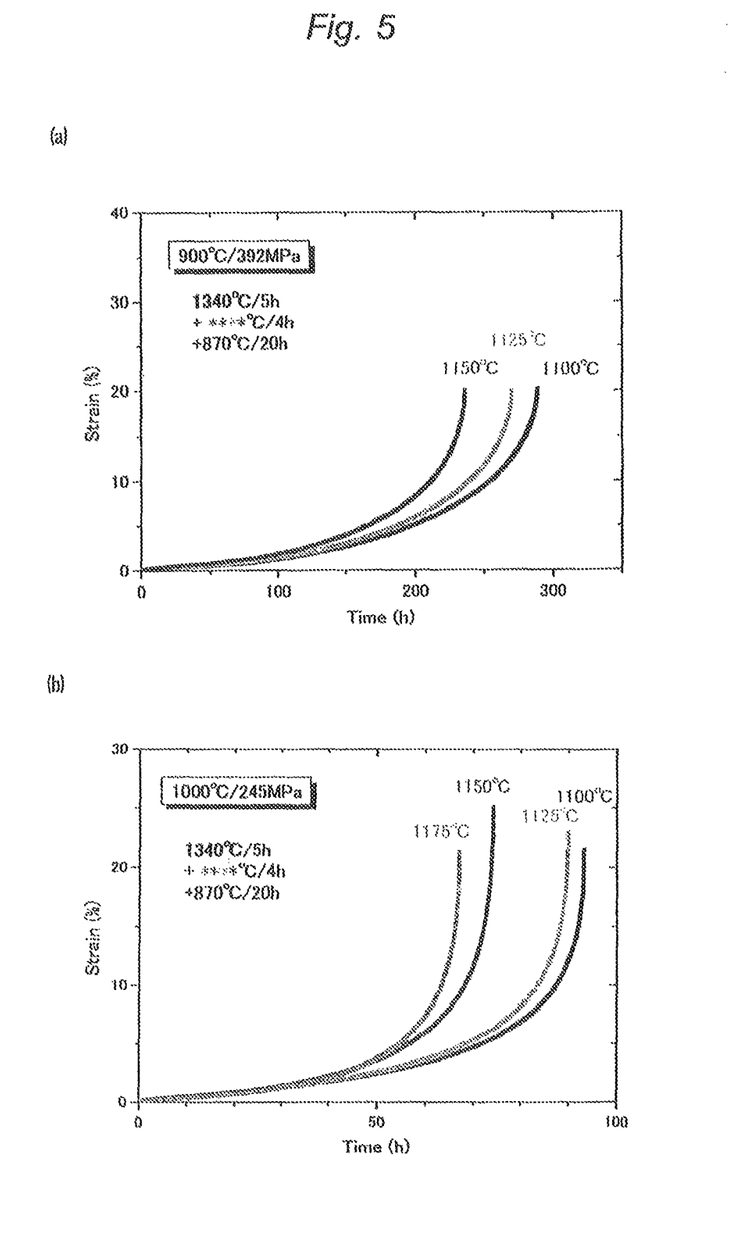
FIGS. 5(a) and 5(b) are each a graph showing any influence of a temperature of primary aging treatment against creep characteristics.

In addition, a Ni-based single crystal superalloy was produced in the same manner as that described above, except that the temperature of the solution treatment was changed to 1,340° C., and any influence of the temperature of the primary aging treatment against the creep characteristics was examined. The results are shown in FIGS. 5(a) and 5(b).

As is confirmed from FIGS. 4(a) and 4(b) and FIGS. 5(a) and 5(b), even in the case of any of creep conditions at 900° C. and 392 MPa and at 1,000° C. and 245 MPa, the creep characteristics are more excellent when the temperature of the primary aging treatment is lower, and the creep characteristics are the most excellent when the temperature of the primary aging treatment is 1,100° C. Meanwhile, it may be considered that even if the temperature of the primary aging treatment is 1,175° C., the required creep characteristics are realized.

Incidentally, in view of the foregoing experimental results, it may be considered that when the temperature of the solution treatment falls within the temperature range of 1,310° C. to 1,340° C., the temperature of the solution treatment does not substantially influence the creep characteristics.

INDUSTRIAL APPLICABILITY

The Ni-based single crystal superalloy of the present invention is excellent in TMF characteristics, creep characteristics, and environment-resistant characteristics such as high-temperature oxidation resistance, small in orientation dependence of creep characteristics, and excellent in cost performance from the standpoint of practical use. Accordingly, the Ni-based single crystal superalloy of the present invention is effective for members to be used under high temperatures and high stresses, such as turbine blades, turbine vanes, etc. in jet engines, gas turbines, and the like.

The invention claimed is:
1. A Ni-based single crystal superalloy comprising
6% A by mass or more and 12% by mass or less of Cr,
0.4% by mass or more and 3.0% by mass or less of Mo,
6% by mass or more and 10% by mass or less of W,
4.0% by mass or more and 6.5% by mass or less of Al,
0% by mass or more and 1% by mass or less of Nb,
8% by mass or more and 12% by mass or less of Ta,
0% by mass or more and 0.15% by mass or less of Hf,
0.01% by mass or more and 0.2% by mass or less of Si, and

0% by mass or more and 0.04% by mass or less of Zr, and
optionally containing at least one element selected from
B, C, Y, La, Ce, and V,
with a balance being Ni and inevitable impurities,
wherein the Ni-based single crystal superalloy does not contain either Re or Co.

2. A Ni-based single crystal superalloy comprising
7% by mass or more and 12% by mass or less of Cr,
0.4% by mass or more and 2.5% by mass or less of Mo,
7% by mass or more and 10% by mass or less of W,
4.0% by mass or more and 6.5% by mass or less of Al,
0% by mass or more and 1% by mass or less of Nb,
9% by mass or more and 11% by mass or less of Ta,
0% by mass or more and 0.15% by mass or less of Hf,
0.01% by mass or more and 0.2% by mass or less of Si, and
0% by mass or more and 0.04% by mass or less of Zr, and
optionally containing at least one element selected from
B, C, Y, La, Ce, and V,
with a balance being Ni and inevitable impurities,
wherein the Ni-based single crystal superalloy does not contain either Re or Co.

3. A Ni-based single crystal superalloy comprising
8% by mass or more and 10% by mass or less of Cr,
0.4% by mass or more and 2.0% by mass or less of Mo,
7% by mass or more and 9% by mass or less of W,
4.0% by mass or more and 6.5% by mass or less of Al,
0% by mass or more and 1% by mass or less of Nb,
10% by mass or more and 11% by mass or less of Ta,
0% by mass or more and 0.15% by mass or less of Hf,
0.01% by mass or more and 0.2% by mass or less of Si, and
0% by mass or more and 0.04% by mass or less of Zr, and
optionally containing at least one element selected from
B, C, Y, La, Ce, and V,
with a balance being Ni and inevitable impurities,
wherein the Ni-based single crystal superalloy does not contain either Re or Co.

4. The Ni-based single crystal superalloy according to claim 1, wherein a composition ratio of the elements which are optionally contained is 0.05% by mass or less for B, 0.15% by mass or less for C, 0.1% by mass or less for Y, 0.1% by mass or less for La, 0.1% by mass or less for Ce, and 1% by mass or less for V.

5. The Ni-based single crystal superalloy according to claim 1, wherein when a creep life $\tau(h)$ is represented by the following formula (1):

$$\tau(h) = -3208 + 11X_{Co} + 40X_{Cr} + 139X_{Mo} + 93X_W + 327X_{Al} + 146X_{Ti} + 45X_{Nb} + 53X_{Ta} \quad (1),$$

wherein $\tau(h)$ represents a creep life (hour), and $X_{Co}$, $X_{Cr}$, $X_{Mo}$, $X_W$, $X_{Al}$, $X_{Ti}$, $X_{Nb}$, and $T_{Ta}$ represent composition ratios (% by mass) of cobalt, chromium, molybdenum, tungsten, aluminum, titanium, niobium, and tantalum, respectively.

6. The Ni-based single crystal superalloy according to claim 5, wherein the creep life $\tau(h)$ is 200 or more.

7. The Ni-based single crystal superalloy according to claim 2, wherein a composition ratio of the elements which are optionally contained is 0.05% by mass or less for B, 0.15% by mass or less for C, 0.1% by mass or less for Y, 0.1% by mass or less for La, 0.1% by mass or less for Ce, and 1% by mass or less for V.

8. The Ni-based single crystal superalloy according to claim 3, wherein a composition ratio of the elements which are optionally contained is 0.05% by mass or less for B, 0.15% by mass or less for C, 0.1% by mass or less for Y, 0.1% by mass or less for La, 0.1% by mass or less for Ce, and 1% by mass or less for V.

9. The Ni-based single crystal superalloy according to claim 2, wherein when a creep life $\tau(h)$ is represented by the following formula (1):

$$\tau(h) = -3208 + 11X_{Co} + 40X_{Cr} + 139X_{Mo} + 93X_W + 327X_{Al} + 146X_{Ti} + 45X_{Nb} + 53X_{Ta} \quad (1),$$

wherein $\tau(h)$ represents a creep life (hour), and $X_{Co}$, $X_{Cr}$, $X_{Mo}$, $X_W$, $X_{Al}$, $X_{Ti}$, $X_{Nb}$, and $T_{Ta}$ represent composition ratios (% by mass) of cobalt, chromium, molybdenum, tungsten, aluminum, titanium, niobium, and tantalum, respectively.

10. The Ni-based single crystal superalloy according to claim 3, wherein when a creep life $\tau(h)$ is represented by the following formula (1):

$$\tau(h) = -3208 + 11X_{Co} + 40X_{Cr} + 139X_{Mo} + 93X_W + 327X_{Al} + 146X_{Ti} + 45X_{Nb} + 53X_{Ta} \quad (1),$$

wherein $\tau(h)$ represents a creep life (hour), and $X_{Co}$, $X_{Cr}$, $X_{Mo}$, $X_W$, $X_{Al}$, $X_{Ti}$, $X_{Nb}$, and $T_{Ta}$ represent composition ratios (% by mass) of cobalt, chromium, molybdenum, tungsten, aluminum, titanium, niobium, and tantalum, respectively.

11. The Ni-based single crystal superalloy according to claim 4, wherein when a creep life $\tau(h)$ is represented by the following formula (1):

$$\tau(h) = -3208 + 11X_{Co} + 40X_{Cr} + 139X_{Mo} + 93X_W + 327X_{Al} + 146X_{Ti} + 45X_{Nb} + 53X_{Ta} \quad (1)$$

wherein $\tau(h)$ represents a creep life (hour), and $X_{Co}$, $X_{Cr}$, $X_{Mo}$, $X_W$, $X_{Al}$, $X_{Ti}$, $X_{Nb}$, and $T_{Ta}$ represent composition ratios (% by mass) of cobalt, chromium, molybdenum, tungsten, aluminum, titanium, niobium, and tantalum, respectively.

12. The Ni-based single crystal superalloy according to claim 9, wherein the creep life $\tau(h)$ is 200 or more.

13. The Ni-based single crystal superalloy according to claim 10, wherein the creep life $\tau(h)$ is 200 or more.

14. The Ni-based single crystal superalloy according to claim 11, wherein the creep life $\tau(h)$ is 200 or more.

15. The Ni-based single crystal superalloy according to claim 5, wherein $\tau(h)$ is 120 or more.

16. The Ni-based single crystal superalloy according to claim 9, wherein $\tau(h)$ is 120 or more.

17. The Ni-based single crystal superalloy according to claim 10, wherein $\tau(h)$ is 120 or more.

18. The Ni-based single crystal superalloy according to claim 11, wherein $\tau(h)$ is 120 or more.

* * * * *